(12) United States Patent
Noborio et al.

(10) Patent No.: US 12,538,792 B2
(45) Date of Patent: Jan. 27, 2026

(54) SEMICONDUCTOR DEVICE AND METHOD FOR MANUFACTURING SEMICONDUCTOR DEVICE

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Masato Noborio, Nisshin (JP); Yoshitaka Kato, Nisshin (JP); Takeshi Endo, Nisshin (JP)

(73) Assignees: DENSO CORPROATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 402 days.

(21) Appl. No.: 17/946,501

(22) Filed: Sep. 16, 2022

(65) Prior Publication Data

US 2023/0106733 A1   Apr. 6, 2023

(30) Foreign Application Priority Data

Sep. 29, 2021   (JP) .................................. 2021-159834

(51) Int. Cl.
  *H01L 23/482*   (2006.01)
(52) U.S. Cl.
  CPC ................................ *H01L 23/4824* (2013.01)
(58) Field of Classification Search
  CPC .... H01L 23/4824; H01L 23/482; H01L 24/05
  See application file for complete search history.

(56) References Cited

U.S. PATENT DOCUMENTS

| | | |
|---|---|---|
| 2008/0315343 A1 | 12/2008 | Kitagawa |
| 2009/0114982 A1 | 5/2009 | Saka et al. |
| 2012/0043638 A1 | 2/2012 | Kitagawa |
| 2021/0257273 A1 | 8/2021 | Kato et al. |
| 2023/0343868 A1* | 10/2023 | Hikasa ................. H10D 62/126 |

FOREIGN PATENT DOCUMENTS

| | | | |
|---|---|---|---|
| JP | 2011-096943 | * | 5/2011 |
| JP | 2011-096943 A | | 5/2011 |
| JP | 2017-204570 A | | 11/2017 |
| JP | 2021-007182 A | | 1/2021 |

* cited by examiner

*Primary Examiner* — Evan G Clinton
*Assistant Examiner* — Corbyn D Mellinger
(74) *Attorney, Agent, or Firm* — Posz Law Group, PLC

(57) ABSTRACT

A semiconductor device includes: an active region having a semiconductor element and a surface electrode provided by a wiring electrode material and connected to the semiconductor element on a side adjacent to a surface of a semiconductor chip; and a pad arrangement region having a pad provided by the wiring electrode material. The pad arrangement region overlaps the active region in a direction normal to the surface of the semiconductor chip. In a part where the pad arrangement region and the active region overlap, the pad is disposed on the surface electrode through an isolation insulating film so that the wiring electrode material is in two layers to provide a double-layer wiring electrode structure. In a part of the active region without overlapping the pad arrangement region, the surface electrode has a single-layer wiring electrode structure composed of a single layer of the wiring electrode material.

17 Claims, 10 Drawing Sheets

- (P1) FORMATION OF SEMICONDUCTOR ELEMENT, AND FORMATION OF INTERLAYER INSULATING FILM
- (P2) FORMATION OF LOWER LAYER WIRING ELECTRODE
- (P3) FORMATION OF ISOLATION INSULATING FILM
- (P4) FORMATION OF UPPER LAYER WIRING ELECTRODE

SEMICONDUCTOR DEVICE AND METHOD FOR MANUFACTURING SEMICONDUCTOR DEVICE

CROSS REFERENCE TO RELATED APPLICATION

The present application claims the benefit of priority from Japanese Patent Application No. 2021-159834 filed on Sep. 29, 2021. The entire disclosures of the above application are incorporated herein by reference.

TECHNICAL FIELD

The present disclosure relates to a semiconductor device having a pad on a surface of a semiconductor chip, and a method for manufacturing the semiconductor device.

BACKGROUND

There is a semiconductor device in which a semiconductor element such as a switching element is formed in a semiconductor chip. In such a semiconductor device, an active region operated as a semiconductor element may be arranged over a wide range including the center of the semiconductor chip. A region of the semiconductor chip different from the active region, specifically, a region adjacent to the active region and along one side of the semiconductor chip may be used as a pad arrangement region in which pads are arranged.

SUMMARY

The present disclosure describes a semiconductor device having an active region and a pad arrangement region overlapping the active region, and a method for manufacturing the semiconductor device.

BRIEF DESCRIPTION OF THE DRAWINGS

Objects, features and advantages of the present disclosure will become more apparent from the following detailed description made with reference to the accompanying drawings. in which.

DETAILED DESCRIPTION

Figure 1:
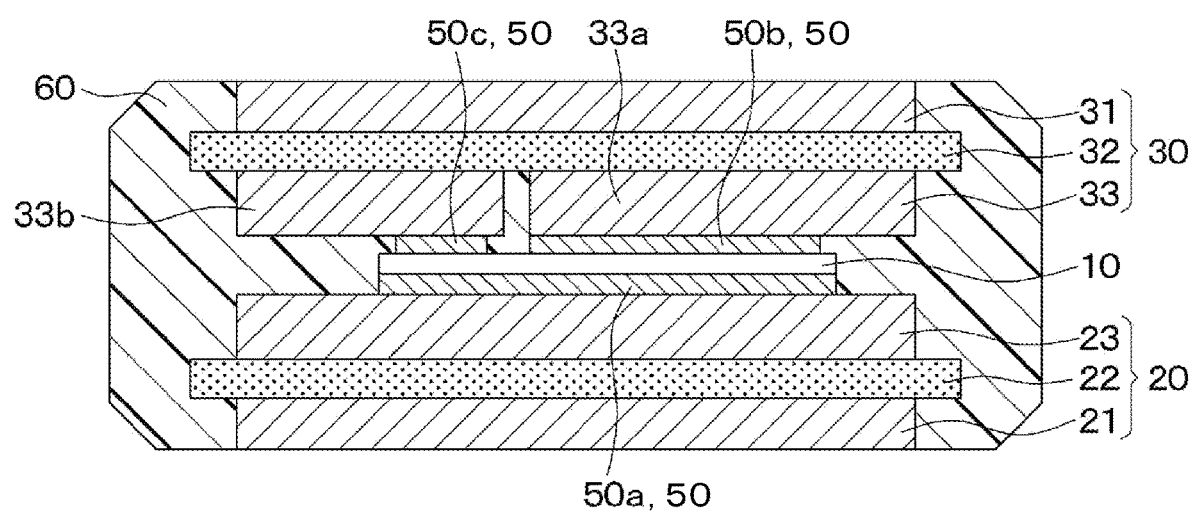
FIG. 1 is a cross-sectional view of a power module according to a first embodiment.

In such a semiconductor device, for example, an active region operated as a semiconductor element may be arranged over a wide range including the center of the semiconductor chip. A region of the semiconductor chip different from the active region, specifically, a region adjacent to the active region and along one side of the semiconductor chip may be used as a pad arrangement region in which pads are arranged.

In the semiconductor device described above, since the active region and the pad arrangement region are separate regions, the pad arrangement region is a region that cannot contribute to operate the switching element. As a result, the ratio of the active region to a total area of the semiconductor chip is reduced due to the area of the pad arrangement region, and it is thus difficult to lower an on-resistance of the semiconductor element small enough.

Therefore, the inventors of the present disclosure have found a structure in which the active region is expanded to a region below the pad in the pad arrangement region so that the region below the pad is also used as the active region. With such a configuration, the ratio of the active region to the total area of the semiconductor chip can be increased, and the on-resistance of the semiconductor element can be lowered.

In the semiconductor device having such a structure, a semiconductor element is formed in a region below the pad arrangement region. Therefore, a wiring electrode material for forming the pad is arranged on a wiring electrode material for forming an electrode connected to the semiconductor element in an overlapping manner. That is, a wiring electrode connected to the semiconductor element is disposed as a lower layer wiring electrode in a first layer, and an upper layer wiring electrode in a second layer is stacked on the lower layer wiring electrode. Further, in the pad arrangement region, it is necessary to insulate the upper layer wiring electrode from the lower layer wiring electrode. Therefore, it is conceivable to arrange an insulating film between the lower layer wiring electrode and the upper layer wiring electrode in the pad arrangement region, whereas to connect the lower layer wiring electrode and the upper layer wiring electrode to each other in a part of the active region that does not overlap the pad arrangement region.

However, as a result of diligent studies by the inventors of the present application, it has been found that the overlapping arrangement of the wiring electrode material results in an excess increase in thickness, and causes an increase in warp or deformation of the semiconductor chip at high temperatures. The present disclosure provides a semiconductor device capable of suppressing an increase in warp of a semiconductor chip while reducing an on-resistance, and a method for manufacturing the same.

According to an aspect of the present disclosure, a semiconductor device is provided by a semiconductor chip, and includes: an active region having a semiconductor element and a surface electrode that is provided by a wiring electrode material and is connected to the semiconductor element on a side adjacent to a surface of the semiconductor chip; and a pad arrangement region having a pad provided by the wiring electrode material. The pad arrangement region is disposed to overlap the active region in a direction normal to the surface of the semiconductor chip. In a part where the pad arrangement region and the active region overlap, the pad is disposed on the surface electrode through an isolation insulating film so that the wiring electrode material is in two layers to provide a double-layer wiring electrode structure. In a part of the active region without overlapping the pad arrangement region, the surface electrode has a single-layer wiring electrode structure composed of a single layer of the wiring electrode material.

In such a configuration, the surface electrode, which has the largest area in parts made of the wiring electrode material on the side adjacent to the surface of the semiconductor chip, has the single-layer wiring electrode structure. That is, a region where the pad is disposed has the double-layer wiring electrode structure, as the pad is stacked on the surface electrode. On the other hand, a region where only the surface electrode is disposed, that is, the region where the surface electrode does not overlap the pad has the single-layer wiring electrode structure in which the wiring electrode material is not in layers. Therefore, it is possible to suppress an increase in warp of the semiconductor chip at high temperatures. Accordingly, in the configuration where the active region is widely provided by forming the semiconductor element in a region below the pad arrangement region, the on resistance can be lowered as well as the increase in warp of the semiconductor chip can be suppressed.

According to an aspect of the present disclosure, a method for manufacturing a semiconductor device that is provided by a semiconductor chip in which a semiconductor element is formed in a semiconductor substrate, includes: forming a surface electrode in an active region; forming an isolation insulating film on the surface electrode; and forming a pad in a pad arrangement region overlapping the active region. In the forming of the surface electrode, the surface electrode is formed in the active region in which the semiconductor element is formed, so that the surface electrode is connected to the semiconductor element. The forming of the surface electrode includes (i) forming the semiconductor element on the semiconductor substrate; (ii) forming an interlayer insulating film adjacent to one surface of the semiconductor substrate, after the forming of the semiconductor element; (iii) forming a contact hole in the interlayer insulating film; (iv) forming a lower layer wiring electrode by a first layer of a wiring electrode material above the interlayer insulating film including inside of the contact hole; and (v) patterning the lower layer wiring electrode so as to form the surface electrode. The forming of the pad includes: (vi) forming an upper layer wiring electrode by a second layer of the wiring electrode material on the isolation insulating film; and (vii) patterning the upper layer wiring electrode so as to form the pad in the pad arrangement region. The forming of the pad further includes (viii) removing the upper layer wiring electrode formed on the surface electrode in a part of the active region that does not overlap the pad arrangement region, so that the surface electrode has a single-layer wiring electrode structure composed of the lower layer wiring electrode; and (ix) leaving the upper layer wiring electrode formed on the surface electrode in a part of the active region overlapping the pad arrangement region, so that the pad is disposed on the surface electrode, thereby to form a double-layer wiring electrode structure composed of the lower layer wiring electrode and the upper layer wiring electrode.

In such a method, in the forming of the pad, the upper layer wiring electrode formed above the surface electrode is removed in the part of the active region without overlapping the pad arrangement region, so that the surface electrode has the single-layer wiring electrode structure composed of the lower layer wiring electrode. In the part of the active region overlapping the pad arrangement region, the pad is disposed above the surface electrode, so that the double-layer wiring electrode structure composed of the lower layer wiring electrode and the upper layer wiring electrode is formed. Accordingly, the method can produce the semiconductor device that is capable of suppressing an increase in warp of the semiconductor chip while lowering the on resistance by the configuration in which the active region is widely provided by forming the semiconductor element in a region below the pad arrangement region.

Hereinafter, embodiments of the present disclosure will be described with reference to the drawings. In the following description of the embodiments, the same or equivalent parts are designated with the same reference numerals.

First Embodiment

A first embodiment will be described. First, with reference to FIG. 1, a configuration in which a semiconductor device according to the present embodiment is applied to a power module will be described as an example.

The power module shown in FIG. 1 incorporates a semiconductor chip 10 therein, and is used as a switching element for driving a motor, for example. The semiconductor chip 10 corresponds to the semiconductor device of the present embodiment. Specifically, the power module includes the semiconductor chip 10, a heat sink 20, a heat sink 30, and the like. The heat sink 20 and the heat sink 30 are joined to the semiconductor chip 10 with a joining material 50 including first to third joining materials 50a to 50c. The semiconductor chip 10, the heat sink 20 and the heat sink 30 are encapsulated with a mold resin 60.

As shown in FIG. 1, a lower surface of the semiconductor chip 10 is joined to an upper surface of the heat sink 20 with the first joining material 50a. The heat sink 20 is provided by a stacked body of a metal layer 21, an insulating layer 22 and a metal layer 23, which are stacked on top of another. The metal layer 23 is joined to the lower surface of the semiconductor chip 10 through the first joining material 50a. Moreover, the upper surface of the semiconductor chip 10 is joined to the heat sink 30 with the second joining material 50b and the third joining material 50c. The heat sink 30 is provided by a stacked body of a metal layer 31, an insulating layer 32 and a metal layer 33, which are stacked on top of another. The metal layer 33 is divided into a plurality of connecting portions 33a and 33b. The connecting portions 33a and 33b are joined to the upper surface of the semiconductor chip 10 through the second joining material 50b and the third joining material 50c, respectively.

Figure 2A:
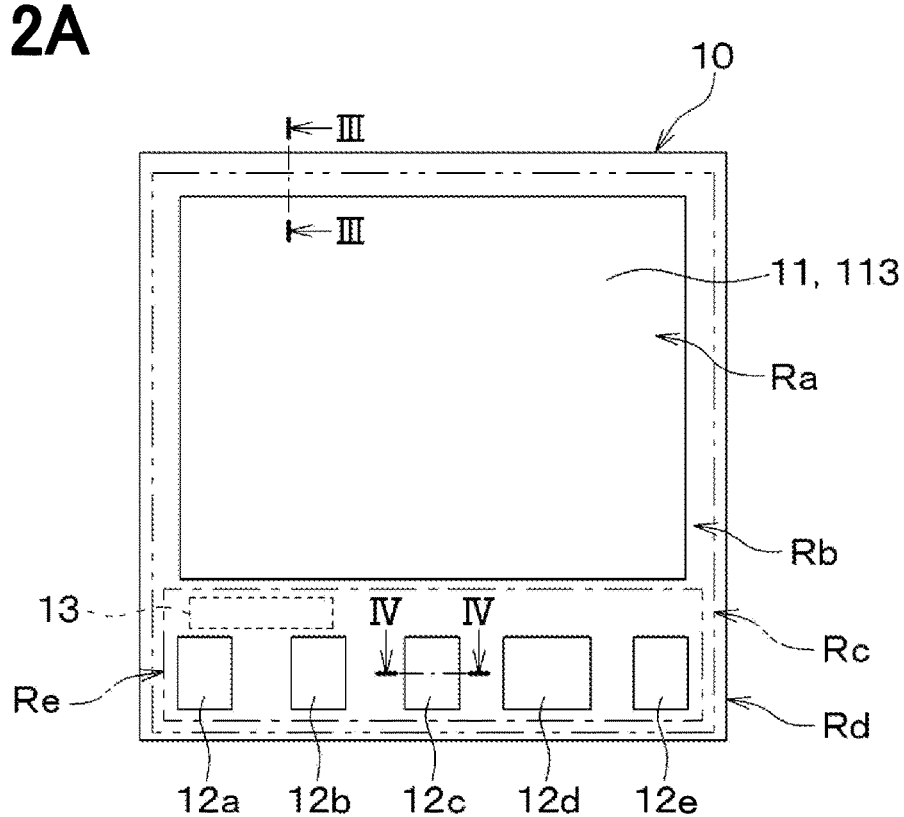
FIG. 2A is a top layout view of a semiconductor chip provided in the power module shown in FIG. 1.

As will be described later, the connecting portion 33a is connected to a source electrode 113 of the semiconductor chip 10. The source electrode 113 corresponds to a main surface electrode disposed in an active region Rb of the semiconductor chip 10, as shown in FIG. 2A. The main surface electrode will be simply referred to as the surface electrode. Also, the connecting portion 33b is connected to each of pads 12a to 12e disposed in a pad arrangement region Re of the semiconductor chip 10. Although only one connecting portion 33b is shown in FIG. 1, the power module includes plural connecting portions 33b correspondingly to the number of the pads 12a to 12e. The connecting portion 33a has a lead portion (not shown), and is electrically connected to an external device through the lead portion being led out from the mold resin 60. Each of the connecting portions 33b also has a lead portion (not shown), and is electrically connected to an external device through the lead portion being led out from the mold resin 60. The metal layer 23 also has a lead portion (not shown), and is electrically connected to an external device through the lead portion being led out from the mold resin 60.

In the present embodiment, for example, the joining material 50 including the first to third joining materials 50a to 50c, is made of a bonding metal such as lead-free solder, which is a conductive material, or a conductive adhesive. The semiconductor chip 10, the heat sink 20, and the heat sink 30 are physically and electrically connected to each other through the joining material 50.

With such a configuration, on the upper surface of the semiconductor chip 10, electrical connection with external devices and heat dissipation are enabled through the second and third joining materials 50b and 50c and the heat sink 30. Likewise, on the lower surface of the semiconductor chip 10, electrical connection with the external device and heat dissipation are enabled through the first joining material 50a and the heat sink 20.

The semiconductor chip 10 is a semiconductor device having a semiconductor substrate in which a semiconductor element is formed. The semiconductor substrate is made of silicon carbide (SiC) or the like. The semiconductor chip 10 has a rectangular thin plate shape, for example. The semiconductor chip 10 may be made of a material other than SiC. However, in the case of SiC, since the semiconductor chip 10 is provided with a semiconductor element requiring a high withstand voltage, the temperature of the semiconductor chip 10 may be higher and the influence due to the warp of the semiconductor chip 10 is likely to increase, as compared with a case where the semiconductor chip 10 is made of another material. Therefore, the present disclosure can be preferably applied in the case where the semiconductor chip 10 is made of SiC.

Examples of semiconductor elements formed in the semiconductor chip 10 include vertical metal oxide semiconductor field effect transistor (MOSFETs) and vertical insulated gate bipolar transistors (IGBTs). In the case of the present embodiment, the semiconductor chip 10 is formed with a vertical MOSFET, the detailed structure of which will be described later.

The connecting portion 33a is joined to a part of the upper surface of the semiconductor chip 10, and the plural connecting portions 33b are connected to parts of the semiconductor chip 10, the parts being on an outside of the part of the semiconductor chip 10 to which the connecting portion 33a is connected. The surface electrode provided in the active region Rb of the semiconductor chip 10, that is, the source electrode 113 of the vertical MOSFET is connected to the connecting portion 33a. The pads 12a to 12e provided in the pad arrangement region Re of the semiconductor chip 10 are connected to the connecting portions 33b. Although only one connecting portion 33b is shown in FIG. 1, the connecting portions 33b are provided as many as the pads 12a to 12e. On the other hand, a back surface electrode, that is, a drain electrode 114 in the case of a vertical MOSFET, is formed on the back surface of the semiconductor chip 10.

The surface of the back surface electrode is entirely connected to the metal layer 23 of the heat sink 20.

In the heat sink 20, the metal layer 21 and the metal layer 23 are arranged on both sides of the insulating layer 22, and are insulated by the insulating layer 22. The metal layer 21 and the metal layer 23 are each made of a metal having a high heat transfer coefficient such as copper, in order to achieve high heat dissipation. Since the metal layer 21 and the metal layer 23 are insulated from each other, the heat sink 20 is exposed from the mold resin 60 on the metal layer 21 side in order to facilitate heat dissipation, while insulating the metal layer 23 from the outside.

In the heat sink 30, the metal layer 31 and the metal layer 33 are arranged on both sides of the insulating layer 32, and are insulated by the insulating layer 32. The metal layer 31 and the metal layer 33 are each made of a metal having a high heat transfer coefficient such as copper, in order to achieve high heat dissipation. Since the metal layer 31 and the metal layer 33 are insulated from each other, the heat sink 30 is exposed from the mold resin 60 on the metal layer 31 side in order to facilitate heat dissipation, while insulating the metal layer 33 from the outside. The metal layer 33 is divided into a plurality of sections to form the connecting portions 33a and 33b. In a conventional configuration, the connecting portions 33b are provided by bonding wires. In a case where the connecting portions 33b are provided by a part of the metal layer 33 included in the heat sink 30, it is possible to achieve high heat dissipation.

The mold resin 60 encapsulates the semiconductor chip 10, the heat sink 20, the heat sink 30, and the like. One surface of the heat sink 20 and one surface of the heat sink 30 are exposed from the mold resin 60. Also, although not shown, one end of a lead portion of each of the metal layers 23 and 33 is exposed from the mold resin 60, and is electrically connectable to an external device.

Next, the detailed structure of the semiconductor chip 10 of the semiconductor device configured as described above will be described.

Figure 2B:
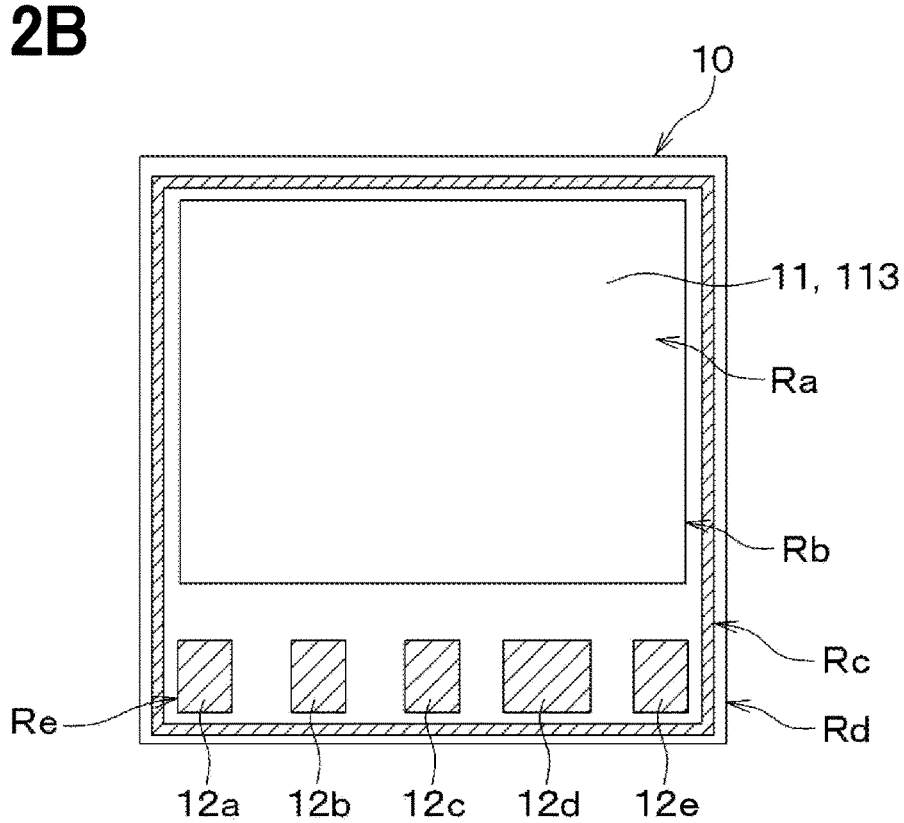
FIG. 2B is a top layout view of a semiconductor chip in which a region having a double-layer wiring electrode structure is shown with hatching.

As shown in FIGS. 2A and 2B, the semiconductor chip 10 has a generally rectangular plate shape. The semiconductor chip 10 has an internal region Ra, an active region Rb, a connecting region Rc, an outer peripheral region Rd, and a pad arrangement region Re.

The internal region Ra is a region including the central portion of the semiconductor chip 10. The internal region Ra is a region from which the source electrode 113 is exposed. The source electrode 113 corresponds to the surface electrode, which will be described later. The exposed portion of the source electrode 113 serves as a source pad 11.

The active region Rb is a region of the semiconductor chip 10 in which the semiconductor element is activated. In the present embodiment, a vertical MOSFET is formed as the semiconductor element in the active region Rb. The active region Rb is formed up to a position a predetermined distance inward from an outer edge of the semiconductor chip 10 while surrounding the internal region Ra. In the present embodiment, the active region Rb is a rectangular region.

The connection region Rc is a region provided between the active region Rb and the outer peripheral region Rd. The connection region Rc has, for example, a rectangular frame shape, and includes a gate wiring layer 120 constituting a gate liner, which will be described later, and the like.

The outer peripheral region Rd is a region arranged around the entire outer edge of the semiconductor chip 10 so as to surround the active region Rb and the connecting region Rc. The outer peripheral region Rd is provided with an outer peripheral withstand voltage structure and the like, and has a rectangular frame shape in the present embodiment.

The pad arrangement region Re is a region in which the various pads 12a to 12e are arranged. The pad arrangement region Re is a region along a part of the active region Rb, for example, along one side of the rectangular shape of the active region Rb. In the example shown in FIG. 2A, the pad arrangement region Re is a region along the lower side of the active region Rb. The pad arrangement region Re is formed so as to overlap the active region Rb in a top view when the semiconductor chip 10 is viewed along a normal direction. That is, the pad arrangement region Re overlaps the active region Rb in a direction normal to the surface of the semiconductor chip 10.

In the present embodiment, a region indicated by a chain double-dashed line in FIG. 2A is the connecting region Rc. A region on the inner side of the connecting region Rc is the active region Rb, and a region on the outer side of the connecting region Rc is the outer peripheral region Rd. In addition, a region surrounded by a dashed line in FIG. 2A is the pad arrangement region Re.

Further, a temperature sensing element region 13 formed with a temperature sensing element is provided in the pad arrangement region Re overlapping with the active region Rb of the semiconductor chip 10. The temperature sensing element region 13 enables to understand a temperature rise due to the semiconductor element based on the temperature detected by the temperature sensing element.

The pads 12a to 12e are provided in the pad arrangement region Re. In the present embodiment, the pad arrangement region Re includes a cathode pad 12a, an anode pad 12b, a gate pad 12c, a first sense pad 12d, and a second sense pad 12e from the left side in FIG. 2A. These pads 12a to 12e are electrically connected to respective parts of the vertical MOSFET provided in the active region Rb and respective parts of the temperature sensing element provided in the temperature sensing element region 13. As these pads 12a to 12e are connected to the connecting portions 33b, electrical connection with external device(s) can be made through the lead portion provided in the connecting portions 33b.

Figure 3:
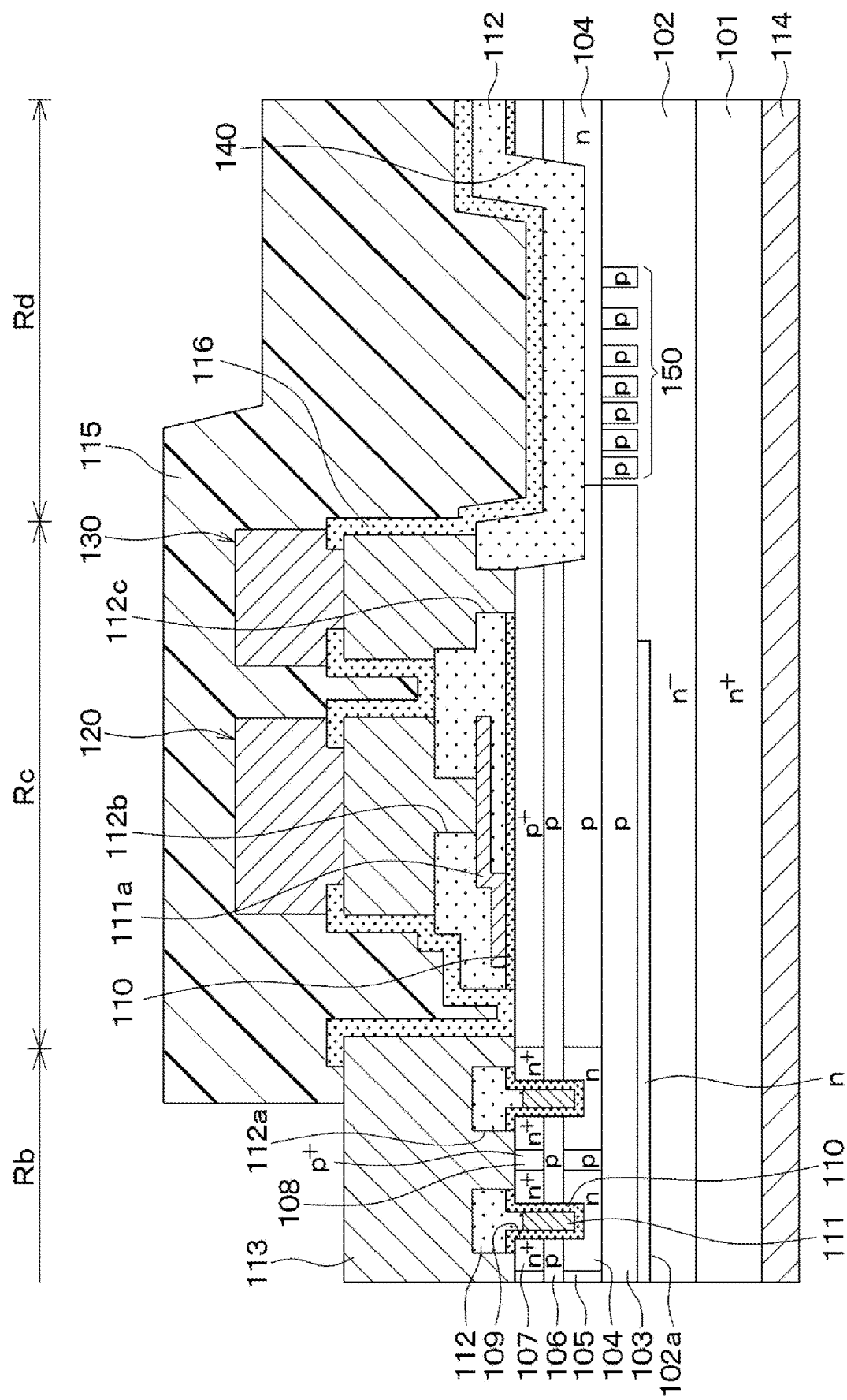
FIG. 3 is a cross-sectional view taken along a line III-III in FIG. 2A in a configuration where a vertical MOSFET is formed in the semiconductor chip.
Figure 4:
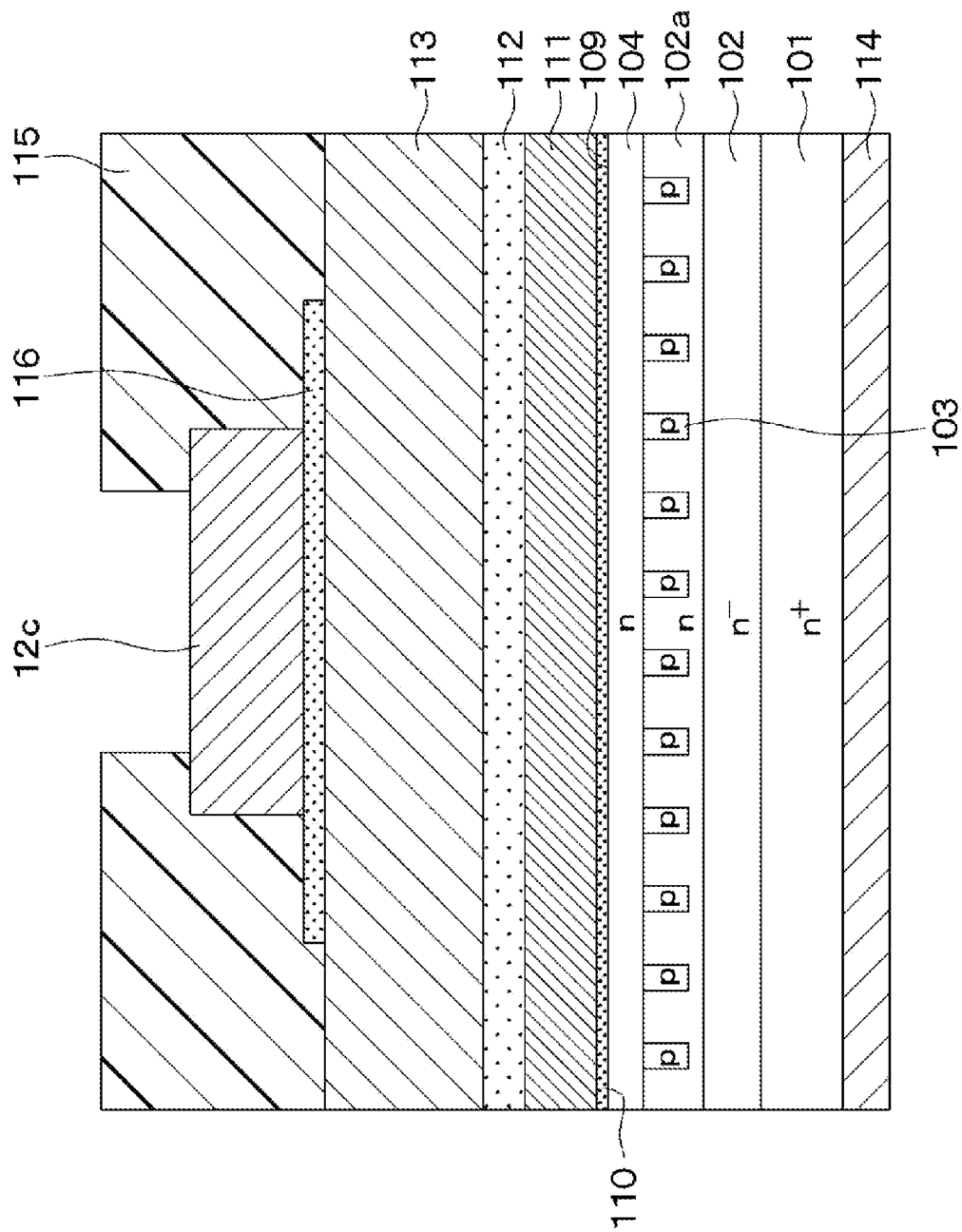
FIG. 4 is a cross-sectional view taken along a line IV-IV in FIG. 2A in the configuration where the vertical MOSFET is formed in the semiconductor chip.

The semiconductor chip 10 has a configuration as shown in cross-sectional views of FIGS. 3 and 4, and the vertical MOSFET is formed in the active region Rb.

The semiconductor chip 10 includes an $n^+$ type substrate 101 made of a semiconductor material such as Si or SiC. An n type low concentration layer 102, having an impurity concentration lower than that of the $n^+$ type substrate 101, is epitaxially grown on a main surface of the $n^+$ type substrate 101.

<Structure of Active Region Rb>

In the active region Rb, as shown in FIGS. 3 and 4, the $n^-$ type low concentration layer 102 is formed with JFET portions 102a. The JFET portions 102a are arranged in stripes extending in one direction as a longitudinal direction at positions away from the $n^+$ type substrate 101. The $n^-$ type low concentration layer 102 including the JFET portions 102a may have the same impurity concentration. In the present embodiment, however, the JFET portions 102a have a higher impurity concentration than the other portion of the $n^-$ type low concentration layer 102, so as to further lower the on resistance.

Between the adjacent JFET portions 102a, p type first deep layers 103 are formed. The first deep layers 103 are also arranged in stripes with one direction as the longitudinal direction. The JFET portions 102a and the first deep layers 103 have the same thickness.

On the JFET portions 102a and the first deep layers 103, current diffusion layers 104 and second deep layers 105 are alternately and repeatedly arranged. The current diffusion layers 104 and the second deep layers 105 have the longitudinal direction along a direction intersecting with the longitudinal direction of the JFET portions 102a and the first deep layers 103. The current diffusion layer 104 has a width greater than that of the second deep layer 105. The second deep layers 105 are connected to the first deep layers 103. A p type base region 106 is formed on the current diffusion layers 104 and the second deep layers 105. Further, $n^+$ type source regions 107 and $p^+$ type contact regions 108 are formed on the p type base region 106. The $n^+$ type source region 107 is formed on a portion of the p type base region 106 corresponding to the current diffusion layer 104, and the $p^+$ type contact region 108 is formed on a portion of the p type base region 106 corresponding to the second deep layer 105.

Gate trenches 109 are formed to pass through the p type base region 106 and the $n^+$ type source region 107 and to reach the current diffusion layer 104. The p type base region 106 and the $n^+$ type source region 107 are arranged so as to be in contact with side surfaces of the gate trench 109. The gate trench 109 is formed into a linear layout with a horizontal direction in FIG. 3 as a width direction, a vertical direction in FIG. 3 as a depth direction, and a direction perpendicular to the width direction and the depth direction as a longitudinal direction. In FIG. 3, only two gate trenches 109 are shown. However, multiple gate trenches 109 are disposed at a regular interval in the horizontal direction, and each of the gate trenches 109 is disposed in a stripe shape and is interposed between the second deep layers 105.

A portion of the p type base region 106 located on the side surface of the gate trench 109 serves as a channel region connecting between the $n^+$ type source region 107 and the current diffusion layer 104 when the vertical MOSFET is operated. A gate insulating film 110 is formed on the inner wall surface of the gate trench 109 including the channel region. A gate electrode 111 composed of doped polysilicon is formed on a surface of the gate insulating film 110, and the gate insulating film 110 and the gate electrode 111 are embedded in the gate trench 109. As a result, a trench gate structure is formed.

As shown in FIG. 4, the trench gate structure extends in a direction corresponding to the horizontal direction of FIG. 2A. As shown in FIG. 3, the multiple trench gate structures are arranged in a direction corresponding to the vertical direction of FIG. 2A. Although not shown, the trench gate structures are formed so as to protrude outside the active region Rb in the horizontal direction of FIG. 2A. The $n^+$ type source region 107 is formed on the side surface of the gate trench 109. The $n^+$ type source region 107 is formed in the active region Rb, but is not formed outside the active region Rb. Therefore, the channel region is formed only inside the active region Rb.

An interlayer insulating film 112 is formed on the respective surfaces of the $n^+$ type source region 107, the $p^+$ type contact region 108, and the trench gate structure. Further, the source electrode 113, which corresponds to the surface electrode, is formed on the interlayer insulating film 112 in the active region Rb. The source electrode 113 is formed by patterning a lower layer wiring electrode made of a wiring electrode material in a first layer. From the source electrode 113, an upper layer wiring electrode made of a wiring electrode material in a second layer is removed. Thus, the source electrode 113 has a single-layer wiring electrode structure.

Contact holes 112a are formed in the interlayer insulating film 112 at positions corresponding to the n+ type source regions 107 and the p+ type contact regions 108. As shown in FIG. 3, thus, the source electrode 113 is electrically in contact with the n+ type source region 107 and the p+ type contact region 108 through the contact hole 112a.

On a rear surface of the n+ type substrate 101, that is, on a rear side of the n+ type substrate 101 opposite from a side to which the source electrode 113 is formed, a drain electrode 114 is formed. The drain electrode 114 corresponds to the back surface electrode and is electrically connected to the n+ type substrate 101. As described above, the vertical MOSFET having an n-channel type inverted trench gate structure is configured. The active region Rb is provided with the vertical MOSFETs arranged for multiple cells. As shown in FIG. 3, the surface of the semiconductor chip 10 is covered with a passivation film 115, and a portion of the passivation film 115 corresponding to the source electrode 113 is removed and opened. A region in which the passivation film 115 is opened correspondingly to the source electrode 113 is the internal region Ra, and an exposed portion of the source electrode 113 serves as the source pad 11.

In addition, as shown in FIG. 4, a part of the active region Rb that overlaps the pad arrangement region Re has substantially the similar configuration to a part of the active region Rb that does not overlap the pad arrangement region Re. However, in the part of the active region Rb overlapping the pad arrangement region Re, that is, in an overlapping region, an isolation insulating film 116 is arranged on the surface of the source electrode 113, and the pads 12a to 12e are formed on the isolation insulating film 116. FIG. 4 shows a cross section of a portion where gate pad 12c is arranged. The other pads 12a, 12b, 12d and 12e are similarly formed on the source electrode 113 with the isolation insulating film 116 interposed therebetween. The pads 12a to 12e are formed by patterning the upper layer wiring electrode, which is the wiring electrode in the second layer. Therefore, as shown in FIG. 2B, in the part of the active region Rb overlapping the pad arrangement region Re, the semiconductor chip 10 has a double-layer wiring electrode structure in which the source electrode 113 and the pads 12a to 12e are stacked on top of the other.

Portions of the passivation film 115 corresponding to the pads 12a to 12e provided in the pad arrangement region Re are also removed so as to form openings. Therefore, the connecting portions 33b can be connected to the pads 12a to 12e.

In the temperature sensing element region 13 that is arranged to overlap the active region Rb, for example, a temperature sensing diode is formed as the temperature sensing element. The temperature sensitive diode is formed by, for example, ion-implanting p-type impurity or n-type impurity into polysilicon to form a plurality of stages of PN diodes. A cathode of the temperature sensitive diode is connected to the cathode pad 12a and an anode of the temperature sensitive diode is connected to the anode pad 12b, so that an electric signal corresponding to the temperature of the semiconductor chip 10 is output.

The other pads 12c to 12e provided in the pad arrangement area Re are electrically connected to respective parts of the vertical MOSFET. The gate pad 12c is electrically connected to the gate electrode 111 through a gate wiring layer 120 forming a gate liner, which will be described later. Accordingly, a gate voltage is applied to the gate electrode 111 through the gate pad 12c. The gate wiring layer 120 is formed, for example, in a rectangular frame shape surrounding the active region Rb in the connection region Rc, that is, in the vicinity of the outer edge of the semiconductor chip 10, and is routed to the vicinity of the gate pad 12c. The first sense pad 12d and the second sense pad 12e are connected to the source electrode 113 of the vertical MOSFET. Specifically, most of the vertical MOSFETs formed in the multiple cells in the active region Rb serve as main cells that supply current to a load such as a motor through the source and the drain, but a part of the vertical MOSFETs serves as a sensing cell for measuring the current flowing in the main cells. The first sense pad 12d is connected to the source electrode 113 on the sense cell side, and outputs the current flowing between the source and drain of the vertical MOSFETs on the sense cell side to the outside so that the current flowing in the main cell can be measured. The second sense pad 12e is connected to the source electrode 113 on the main cell side, and outputs the source potential to the outside through the second sense pad 12e.

<Structure of Connecting Region Rc>

As shown in FIG. 3, also in the connecting region Rc, the JFET portions 102a and the first deep layers 103 are formed on the n− type low concentration layer 102 up to the position near the outer peripheral region Rd. However, the current diffusion layer 104 is not provided on these layers, and only the second deep layer 105 is formed. In addition, no trench gate structure is formed, and only the p type base region 106 and the p+ type contact region 108 are formed on the second deep layer 105.

In addition, on the gate insulating film 110 formed on the p type base region 106 and the p+ type contact region 108, the gate lead-out portion 111a made of doped polysilicon and led out from the gate electrode 111 is formed. The interlayer insulating film 112 is formed so as to cover the gate lead-out portion 111a, and the gate wiring layer 120 is formed on the interlayer insulating film 112. The gate wiring layer 120 constitutes a gate liner, and is routed in a rectangular frame shape so as to surround the active region Rb, for example, and is connected to the gate pad 12c. A contact hole 112b is formed in the interlayer insulating film 112 at a position corresponding to the gate wiring layer 120, and the gate wiring layer 120 and the gate lead-out portion 111a are electrically connected to each other through the contact hole 112b.

Further, a hole extracting layer 130 is formed on the interlayer insulating film 112, at a part adjacent to the outer peripheral region Rd than the gate wiring layer 120. A contact hole 112c is formed in the interlayer insulating film 112 at a position corresponding to the hole extracting layer 130, and the hole extracting layer 130 is electrically connected to the p+ type contact region 108 through the contact hole 112c.

As shown in FIGS. 2B and 3, the gate wiring layer 120 and the hole extracting layer 130 formed in the connecting region Rc are also formed by patterning the lower layer wiring electrode as the wiring electrode in the first layer and the upper layer wiring electrode as the wiring electrode in the second layer. In each have the double-layer wiring electrode structure made of the lower layer wiring electrode and the upper layer wiring electrode.

In order to electrically isolate the pads 12a to 12e from the source electrode 113, the isolation insulating film 116 is formed between the lower layer wiring electrode and the upper layer wiring electrode. Therefore, in the gate wiring layer 120 and the hole extracting layer 130, the isolation insulating film 116 formed between the lower layer wiring electrode and the upper layer wiring electrode is removed so as to electrically connect the lower layer wiring electrode and the upper layer wiring electrode. In this way, since the gate wiring layer 120 and the hole extracting layer 130 each have the double-layer wiring electrode structure, the wiring resistance can be reduced.

In a cross-section different from the cross-sections shown in FIGS. 3 and 4, the gate wiring layer 120 is connected to the gate pad 12c, and the hole extracting layer 130 is connected to a portion having the ground potential, for example, the second sense pad 12e.

<Structure of Outer Peripheral Region Rd>

In the outer peripheral region Rd, the p type base region 106 and the second deep layer 105 are removed, and a recess 140 is formed. A plurality of p type guard rings 150 are arranged at positions corresponding to the bottom surface of the recess 140 so as to surround the active region Rb. Since the p type guard rings 150 are provided, the equipotential lines can be further extended to the outside of the active region Rb and terminated, thereby alleviating the electric field concentration and ensuring the withstand voltage in the outer peripheral region Rd.

In the outer peripheral region Rd, the surface is entirely covered with the passivation film 115 so as to be protected. As described above, the power module provided with the semiconductor chip 10 corresponding to the semiconductor device of the present embodiment is configured.

The power module is operated, for example, when a voltage of about 10 V is applied to the drain electrode 114 through the metal layer 23, the source electrode 113 is grounded through the connecting portion 33a, and a predetermined voltage is applied to the gate electrode 111 through the connecting portion 33b. That is, when a gate voltage is applied to the gate electrode 111, a channel region is formed in a portion of the p type base region 106 contacting the trench gate structure. As a result, the vertical MOSFET is turned on, and an operation of causing the current to flow between the source and the drain is performed.

Even when a high voltage is applied to the drain electrode 114, since the first deep layer 103 is fixed at the source potential through the second deep layer 105 and the p type base region 106, it is possible to suppress the equipotential lines from climbing up to the trench gate structure. In addition, since the outer peripheral region Rd is provided with the outer peripheral withstand voltage structure such as the p type guard rings 150, the equipotential lines are guided further to the outer peripheral side, so that electric field concentration is alleviated. As such, it is possible to realize the vertical MOSFET capable of withstanding a high voltage.

When the vertical MOSFET is operated as described above, the temperature of the semiconductor chip 10 is likely to rise. As a result, if the thickness of each part provided by the wiring electrode is large, warp of the semiconductor chip 10 is likely to increase. In the present embodiment, the thickness of the source pad 11, that is, the source electrode 113, which is the pad formed by opening the passivation film 115 with the largest area, is reduced. Therefore, it is possible to suppress an increase in warp of the semiconductor chip 10 at high temperatures.

Specifically, the source electrode 113, the gate wiring layer 120, the hole extracting layer 130, and the pads 12a to 12e are provided by patterning the lower layer wiring electrode, which is the wiring electrode in the first layer, and/or the upper layer wiring electrode, which is the wiring electrode in the second layer. In have the double-layer wiring electrode structure made of the lower layer wiring electrode and the upper layer wiring electrode, whereas the source electrode 113 has the single-layer wiring electrode structure formed by removing the upper layer wiring electrode while remaining the lower layer wiring electrode. Further, the pads 12a to 12e have the single-layer wiring electrode structure made of the upper layer wiring electrode.

In this way, on the front surface side of the semiconductor chip 10, the source electrode 113, which has the largest area among the parts made of the wiring electrode material, has the single-layer wiring structure. In other words, even if the part where the pads 12a to 12e are arranged has the double-layer wiring electrode structure in which the pads 12a to 12e are stacked on the source electrode 113, the part where only the source electrode 113 is arranged has the single-layer wiring electrode structure without having the stacked structure. Therefore, it is possible to suppress an increase in warp of the semiconductor chip 10 at high temperatures.

As such, it is possible to suppress the increase in warp of the semiconductor chip 10 while suppressing the on resistance by forming the semiconductor element under the pad arrangement region Re so as to use a wide range of the semiconductor chip 10 as the active region Rb. By suppressing the increase in the warp of the semiconductor chip 10, it is possible to suppress the deterioration of characteristics of the semiconductor element due to the warp, and to further reduce the on resistance. Moreover, since heat can be dissipated also through the connecting portion 33b, even if the active region Rb is laid so as to overlap the pad arrangement region Re, the heat generated in that portion can also be dissipated through the connecting portion 33b.

Figure 5:
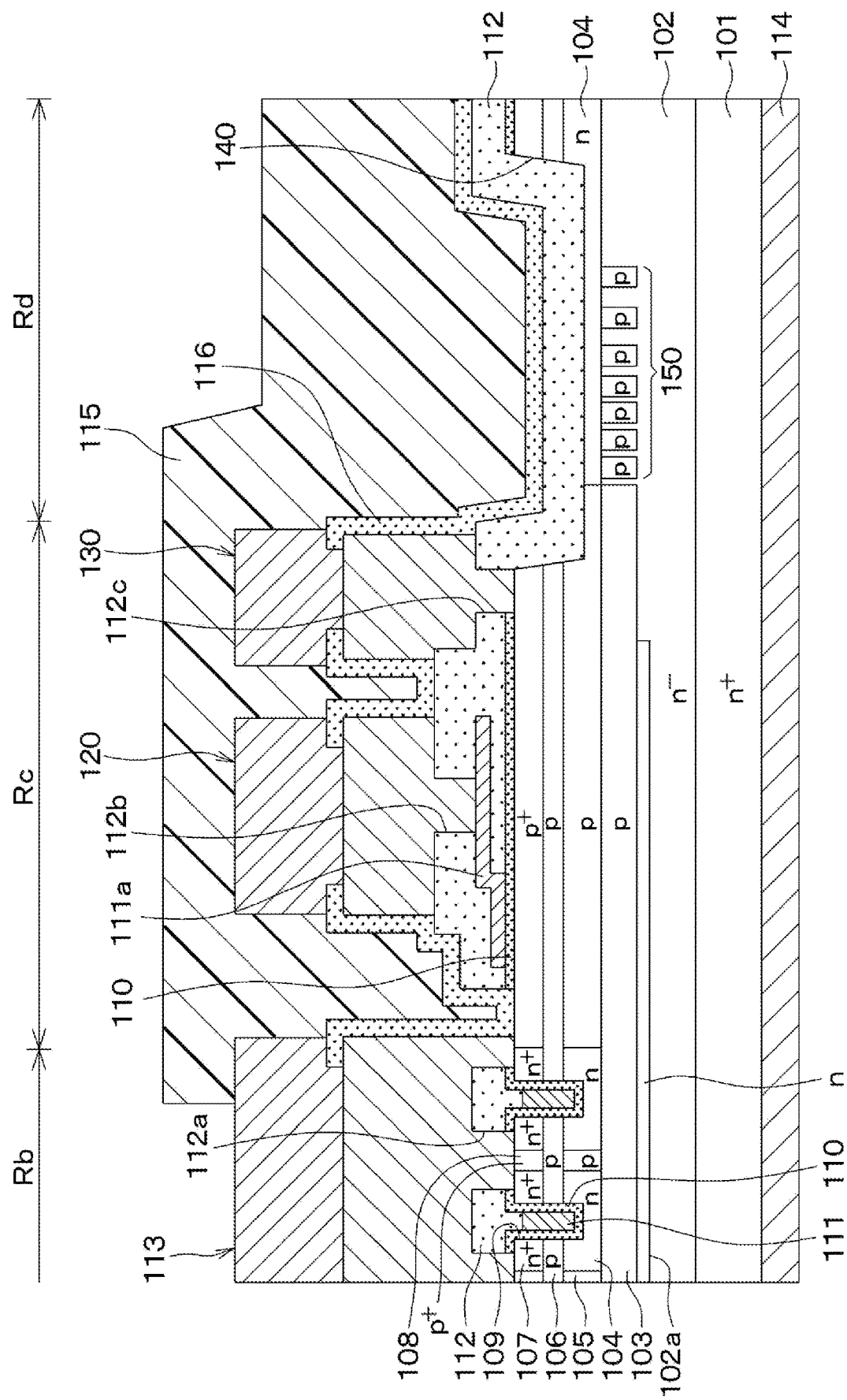
FIG. 5 is a cross-sectional view of a semiconductor chip as a comparative example, corresponding to the cross-sectional view taken along the line III-Ill in FIG. 2A.
Figure 6:
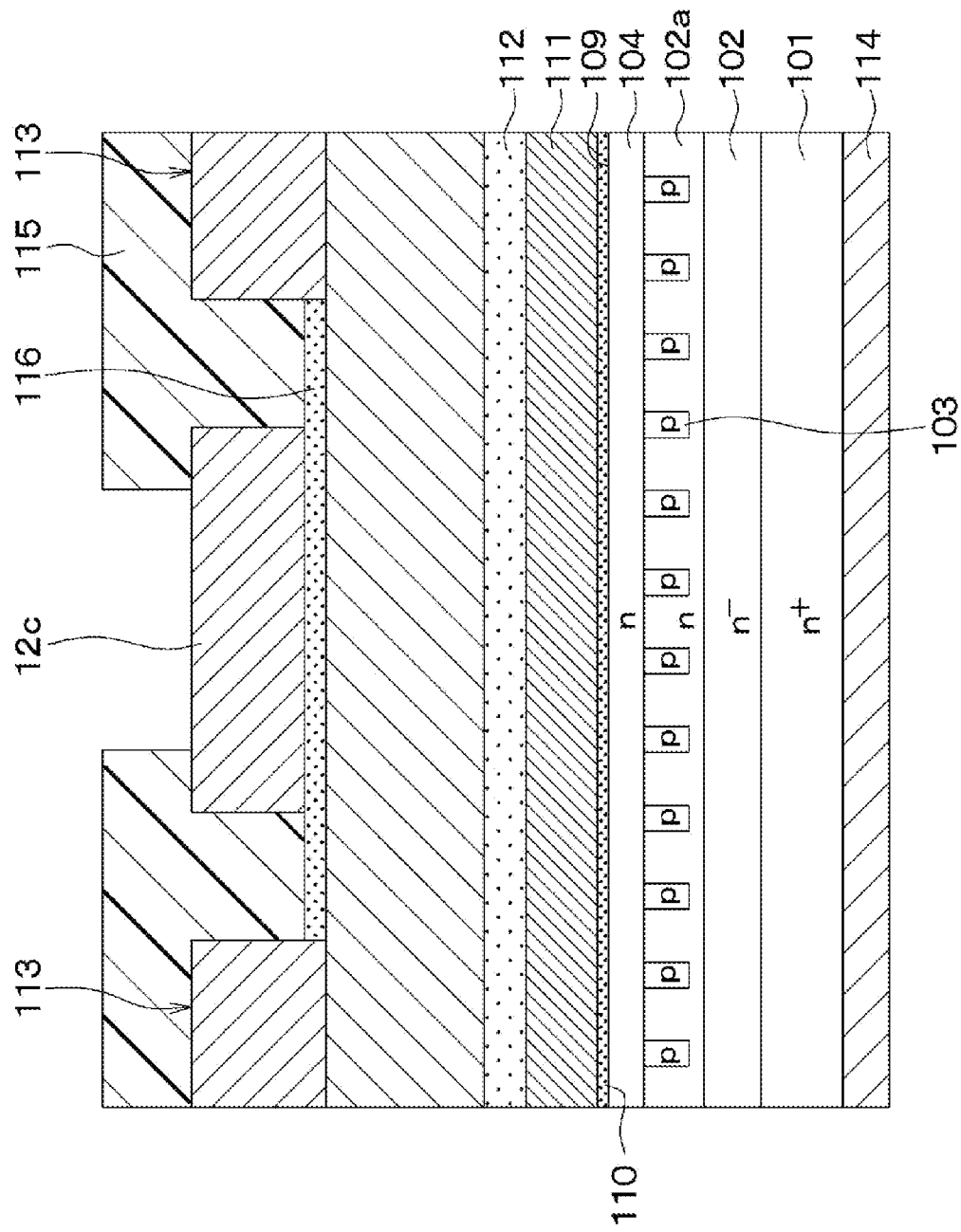
FIG. 6 is a cross-sectional view of the semiconductor chip as the comparative example, corresponding to the cross-sectional view taken along the line IV-IV in FIG. 2A.

The structure of the present embodiment was actually fabricated, and changes in the on resistance were examined for the structure of the present embodiment and a comparative example in which the source electrode 113 also had a double-layer wiring electrode structure. The structure of the present embodiment actually fabricated is the structure shown in FIGS. 3 and 4. The comparative example has the structure shown in FIGS. 5 and 6. That is, as shown in FIGS. 5 and 6, not only the pads 12a to 12e, but also the source electrode 113, the gate wiring layer 120 and the hole extracting layer 130 all have the double-layer wiring electrode structure.

Figures 7, 8:
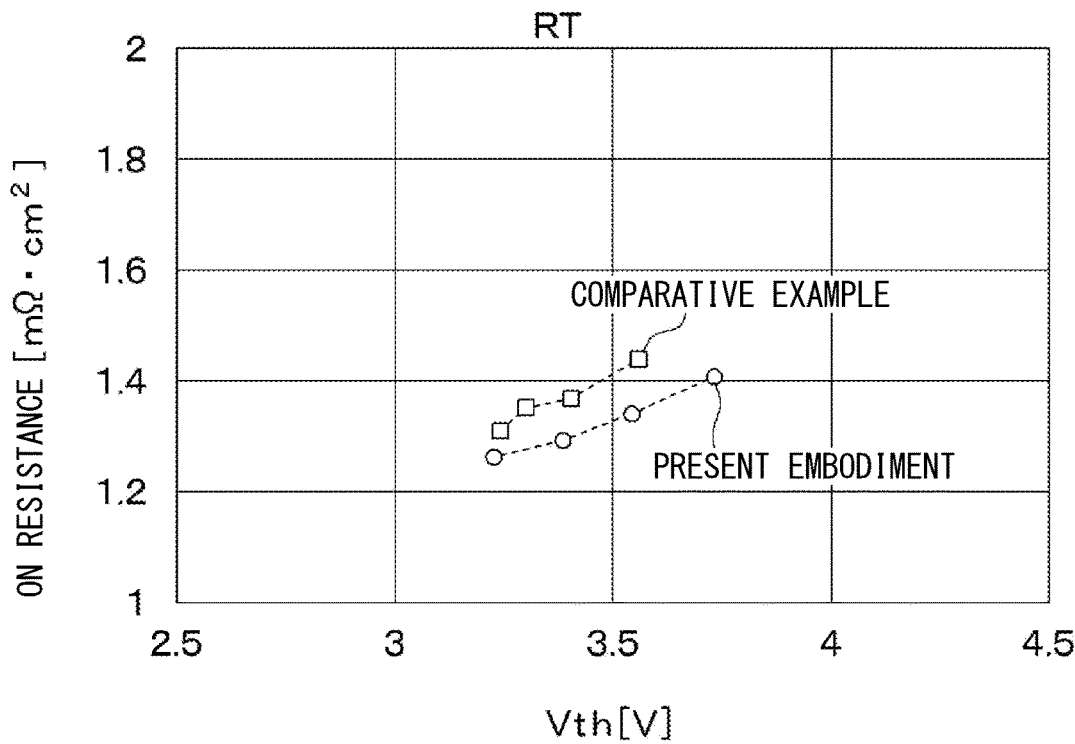
FIG. 7 is a diagram showing simulation results of the on-resistances of the semiconductor chips of the first embodiment and the comparative example.
FIG. 8 is a flow chart showing a method for manufacturing a semiconductor device.

FIG. 7 shows the evaluation results of the on resistance. Specifically, the gate voltage is adjusted so as to cause the current having a predetermined current value between the source and the drain while applying 10 V to the drain electrode 114 and setting the source electrode 113 to the ground potential. In this state, the on resistance was measured for each case. In this case, four vertical MOSFETS with different characteristics were fabricated for each case. As a result, regardless of the characteristics of the vertical MOSFETs, the on resistance in the structure of the present embodiment is reduced by about 5% than that of the comparative example in which the source electrode 113 has the double-layer wiring electrode structure. According to the evaluation results, it is appreciated that the on resistance can be further reduced by adopting the structure of the present embodiment. The reasons are presumed as follows.

In the comparative example having the double-layer wiring electrode structure, an oxide layer is formed on the surface of the lower layer wiring electrode, and the contact resistance between the lower layer wiring electrode and the upper layer wiring electrode increases, resulting in the increase in the on resistance. In contrast, in the configuration of the present embodiment, even if an oxide layer is formed on the source electrode 113 at the time when the isolation insulating film 116 is formed as will be described later, the oxide layer can be removed when removing the upper layer wiring electrode formed on the oxide layer. For this reason, it is considered that the contact resistance of the source electrode 113 is reduced and the on resistance is thus reduced.

Next, a method for manufacturing the semiconductor chip 10 configured as described above, that is, a method for manufacturing a semiconductor device will be described. Note that, in the method for manufacturing the semiconductor device, the process of forming the semiconductor element, the process of forming the interlayer insulating film 112, and the process of forming the contact holes 112a to 112c may be performed by any techniques and may be performed by using known techniques. Therefore, only the processes after the process of forming the contact holes 112a to 112c will be described hereinafter.

First, as shown in a flow chart of FIG. 8, after forming the semiconductor element, the interlayer insulating film 112 is formed, and the contact holes 112a to 112c are formed in the interlayer insulating film 112 (P1). Then, the source electrode 113, the gate wiring layer 120, the gate lead-out portion 111a and the pads 12a to 12e are formed by performing the respective processes shown thereafter.

Specifically, a lower layer wiring electrode is formed on the interlayer insulating film 112 including the insides of the contact holes 112a to 112e (P2). As the lower layer wiring electrode, for example, a wiring electrode material such as AlSi as a main material is deposited by sputtering. In this case, the lower layer wiring electrode is preferably formed after forming a layered structure of Ti/TiN by sputtering in order to form a barrier metal layer as a base layer, instead of forming the wiring electrode material directly on the semiconductor layer. Next, after applying a resist on the lower layer wiring electrode, exposure and development are performed to form a resist mask. Then, the lower layer wiring electrode is wet-etched by using the resist mask. If the base layer has been formed, the base layer is dry-etched. Thereafter, the resist mask is peeled off and the cleaning process is performed. Further, sintering is performed. As a result, the patterning of the lower layer wiring electrode is completed, the source electrode 113 is thus formed, as well as the portions of the gate wiring layer 120 and the hole extracting layer 130 formed by the lower layer wiring electrode are thus formed.

Subsequently, the isolation insulating film 116 is formed (P3). For example, a silicon oxide film such as an undoped silicate glass (USG) or a silicon nitride film is deposited as an insulating material for forming the isolation insulating film 116. By using the silicon oxide film or the silicon nitride film, the lower layer wiring electrode and the upper layer wiring electrode can be properly insulated. Moreover, the use of the silicon nitride film achieves the effect of suppressing the oxidation of the portion of the lower layer wiring electrode covered with the silicon nitride film. After applying a resist on the isolation insulating film 116, exposure and development are performed to form a resist mask. Then, the isolation insulating film 116 is patterned by performing dry etching using the resist mask. In this case, the isolation insulating film 116 is left in the regions where the pads 12a to 12e are to be formed, whereas the isolation insulating film 116 is not left on the surface of the portion of the lower layer wiring electrode forming the source electrode 113 and the surfaces of the portions of the lower layer wiring electrode forming the gate wiring layer 120 and the hole extracting layer 130. After that, when the resist mask is peeled off and the cleaning treatment is performed, the isolation insulating film 116 having a desired pattern is formed.

Further, an upper layer wiring electrode is formed so as to cover the portions composed of the lower layer wiring electrode such as the source electrode 113 including the top of the isolation insulating film 116 (P4). For example, as the upper layer wiring electrode, a wiring electrode material such as AlSi is deposited by sputtering. Also in this case, the upper layer wiring electrode is preferably formed after forming a layered structure of Ti/TiN by sputtering in order to form a barrier metal layer as a base layer, instead of directly forming the wiring electrode material. Next, after applying a resist on the upper layer wiring electrode, exposure and development are performed to form a resist mask. Then, the upper wiring electrode is wet-etched by using the resist mask. If the base layer has been formed, the base layer is dry-etched. After that, the resist mask is peeled off and the cleaning process is performed, and then the sintering is performed. As a result, the patterning of the upper layer wiring electrode is completed, and the portions of the gate wiring layer 120 and the hole extracting layer 130 composed of the upper layer wiring electrode are formed. Also, the pads 12a to 12e are formed.

In the patterning of the upper layer wiring electrode, it is possible to prevent the removal of the lower layer wiring electrode by controlling the etching time when removing the upper layer wiring electrode. In the case where the barrier metal layer is formed as the base layer, the barrier metal layer can be used as an etching stopper. An oxide layer may be formed on the surface of the source electrode 113 when the isolation insulating film 116 is formed. However, the oxide layer can be removed at the same time as removing the upper wiring electrode. Therefore, the contact resistance of the source electrode 113 can be reduced, and the on resistance can be reduced.

Thereafter, the semiconductor chip 10 can be manufactured through various processes such as a process of forming the passivation film 115 made of, for example, polyimide isoindoloquinazolinedione (PIQ), a process of forming a drain electrode 114 as a back surface electrode, and a chipping process by dicing.

Second Embodiment

The following describes a second embodiment. In the present embodiment, the region having the double-layer wiring electrode structure is different from that of the first embodiment. The other configurations are similar to those of the first embodiment. Therefore, only the configurations different from the first embodiment will be hereinafter described.

Figure 9:
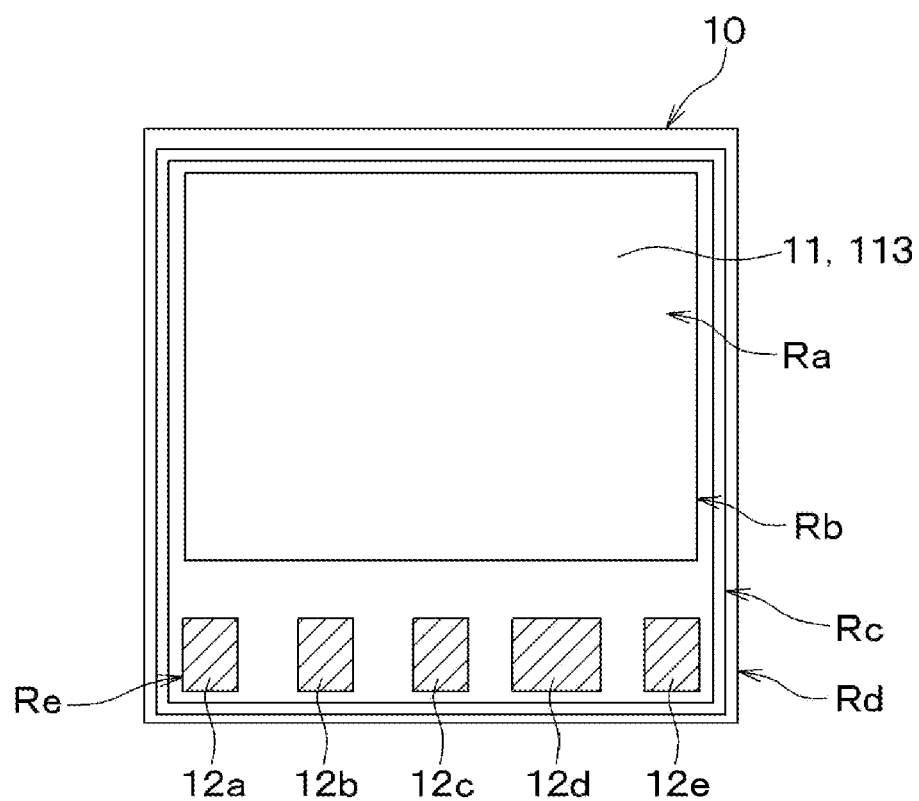
FIG. 9 is a top layout view of a semiconductor chip in which a region having a double-layer wiring electrode structure is shown with hatching.
Figure 10:
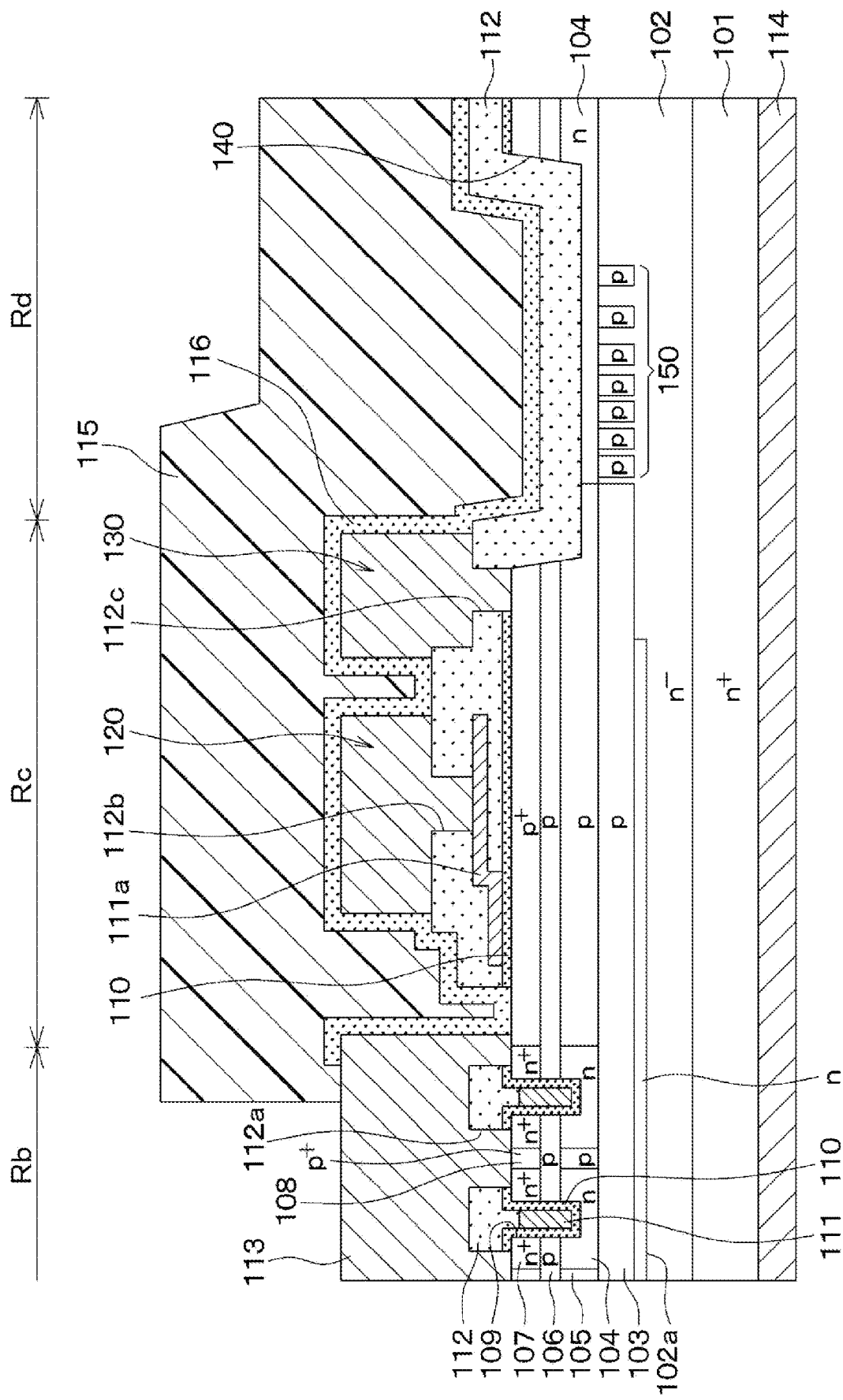
FIG. 10 is a cross-sectional view of a semiconductor chip according to a second embodiment, corresponding to the cross-sectional view taken along the line III-III in FIG. 2A.

As shown in FIG. 9, in the present embodiment, only the regions corresponding to the pads 12a to 12e in the pad arrangement region Re have the double-layer wiring electrode structure, and all other regions have the single-layer wiring electrode structure. Specifically, as shown in FIG. 10, in the present embodiment, not only the source electrode 113 in the part of the active region Rb without overlapping the pad arrangement region Re, but also the gate wiring layer 120 and the hole extracting layer 130 have the single-layer wiring electrode structure.

With such a structure, the thicknesses of the gate wiring layer 120 and the hole extracting layer 130 can be reduced, and it is possible to suppress an increase in warp of the semiconductor chip 10 at high temperatures. In a case where the gate wiring layer 120 and the hole extracting layer 130 are formed to have the double-layer wiring electrode structure as in the first embodiment, it is necessary to remove the isolation insulating film 116 formed between the lower layer wiring electrode and the upper layer wiring electrode. However, in the case where the gate wiring layer 120 and the hole extracting layer 130 are made of only the lower layer wiring electrode, it is not necessary to remove the isolation insulating film 116 from the regions other than the region corresponding to the portion of the gate wiring layer 120 connected to the gate pad 12c and the region corresponding to the portion of the hole extracting layer 130 connected to the second sense pad 12e. Therefore, in the case where the isolation insulating film 116 is composed of a silicon nitride film, the oxidation of the gate wiring layer 120 and the hole extracting layer 130 can be further suppressed.

Third Embodiment

The following describes a third embodiment. In the present embodiment, the ratio of the region having the double-layer wiring electrode structure is defined in contrast to the configurations of the first and second embodiments, and other configurations are the same as those in the first and second embodiments. Thus, only the configurations different from the first and second embodiments will be hereinafter described.

As described above, in the first embodiment, the regions where the pads 12a to 12e are arranged, the gate wiring layer 120 and the hole extracting layer 130 have the double-layer wiring electrode structure. In the second embodiment, the regions where the pads 12a to 12e are arranged have the double-layer wiring electrode structure. The area of the regions having the double-layer wiring electrode structure is preferably 30% or less of the area of the active region Rb. Specifically, the warp of the semiconductor chip 10 at high temperatures increases as the area of the double-layer wiring electrode structure increases. Also, the area of the active region Rb is regarded as the area of the region that generates heat. There is a correlation between the area of the active region Rb and the area of the region having the double-layer wiring electrode structure. When the ratio of the area of the region having the double-layer wiring electrode structure to the area of the active region Rb is 30% or less, the increase in warp of the semiconductor chip 10 was suppressed within the more preferred range.

Therefore, by setting layout of the respective parts so that the ratio of the area of the region having the double-layer wiring electrode structure to the area of the active region Rb is 30% or less, the increase in warp of the semiconductor chip 10 can be further suppressed.

Fourth Embodiment

The following describes a fourth embodiment. The present embodiment defines the pad layout in the semiconductor chip 10 in contrast to the first to third embodiments, and the other configurations are similar to those of the first to third embodiments. Thus, only the configurations different from the first to third embodiments will be described hereinafter.

Figure 11:
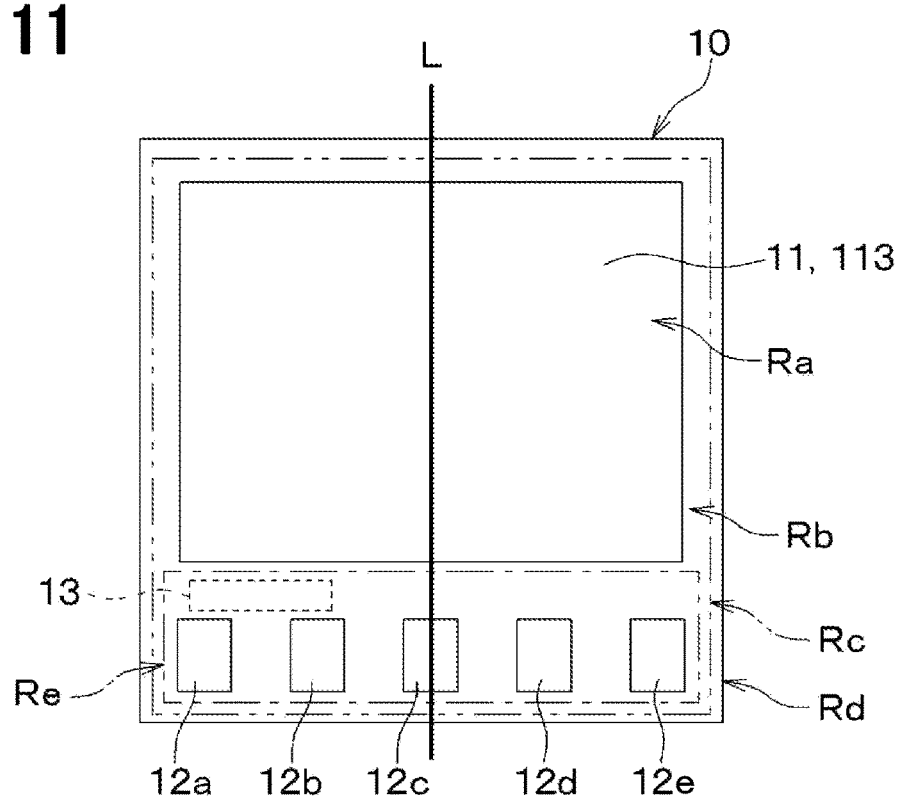
FIG. 11 is a top layout view of a semiconductor chip according to a fourth embodiment.

In the present embodiment, as shown in FIG. 11, the layouts of the internal regions Ra constituting the source pad 11 and the pads 12a to 12e formed in the semiconductor chip 10 are line symmetrical with respect to a straight line L. The straight line L is a center line that passes through the center of the internal region Ra that constitutes the rectangular source pad 11, among centerlines of the semiconductor chip 10. The source pad 11 itself is line symmetrical with respect to the straight line L. Also, the pads 12a to 12e are arranged line symmetrical with respect to the straight line L.

With such a configuration, the warp of the semiconductor chip 10 can be uniform with respect to the straight line L as the center. For this reason, it is easier to predict the warp, and it is easier to design the semiconductor chip 10 in consideration of the warp.

Fifth Embodiment

The following describes a fifth embodiment. The present embodiment defines the number of pads in the semiconductor chip 10 in contrast to the first to fourth embodiments. The other configurations are similar to those of the first to fourth embodiments. Thus, only the configurations different from the first to fourth embodiments will be described hereinafter.

Figure 12:
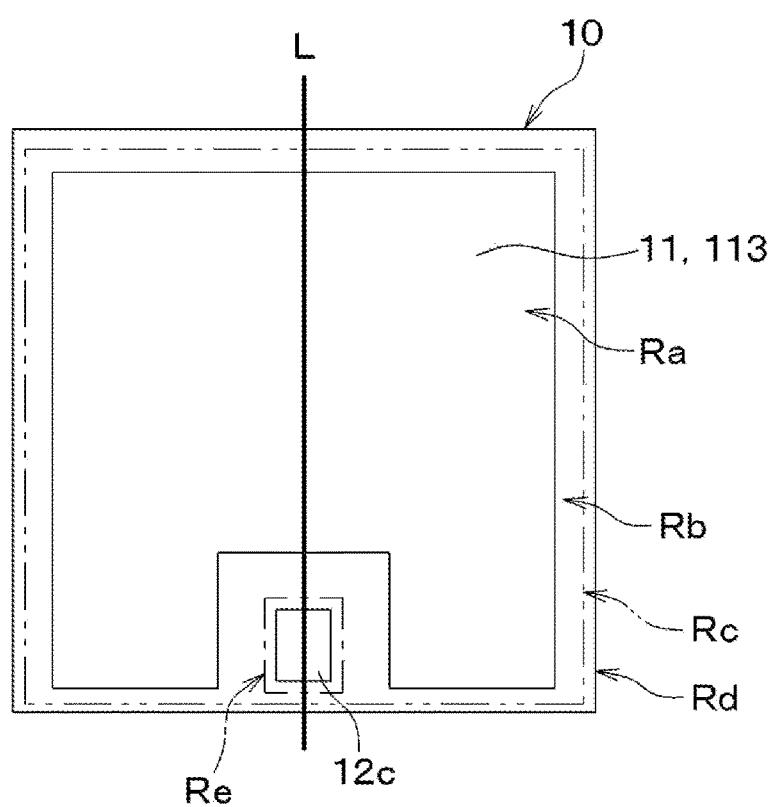
FIG. 12 is a top layout view of a semiconductor chip according to a fifth embodiment.

In the present embodiment, as shown in FIG. 12, the semiconductor chip 10 includes the gate pad 12c in addition to the internal region Ra constituting the source pad 11, but does not include the other pads 12a, 12b, 12d, and 12e. That is, the number of pad(s) having the double-layer wiring electrode structure is only one.

The warp of the semiconductor chip 10 increases with the increase in the area of the region having the double-layer wiring electrode structure. Therefore, it is preferable to reduce the number of pads having the double-layer wiring electrode structure, preferably to be five or less. In the first to fourth embodiments, the number of pads having the double-layer wiring electrode structure is five. However, the number of the pads having the double-layer wiring electrode structure may be less than five. Therefore, by setting the number of pads to be less than five, for example to one, which is the smallest number, as in the present embodiment, it is possible to further suppress the increase in the warp of the semiconductor chip 10.

In the present embodiment, the gate pad 12c is arranged along the central portion of one side of the rectangular semiconductor chip 10, and the internal region Ra constituting the source pad 11 is formed so as to surround the gate pad 12c as in a recessed form defining an opening around the gate pad 12c, that is on a lower side in FIG. 12. Further, similar to the fourth embodiment, the source pad 11 itself is line symmetrical with respect to the straight line L, as well as the gate pad 12c is line symmetrical with respect to the straight line L. However, such a layout is an example layout of the semiconductor chip 10 when the number of pads having the double-layer wiring electrode structure is five or less. The semiconductor chip 10 may have any other layouts as long as the number of pads satisfies the conditions.

OTHER EMBODIMENTS

While the present disclosure has been described in accordance with the embodiments described above, the present disclosure is not limited to the embodiments described above, and includes various modifications and equivalent modifications. Furthermore, various combinations and aspects, and other combination and aspect including only one element, more than one element or less than one element, are also within the sprit and scope of the present disclosure.

For example, in each of the embodiments described above, the vertical MOSFET is used as an example of the semiconductor element provided in the active region Rb. However, the semiconductor element may be provided by any other element such as a vertical IGBT or a diode, or combinations of different types of elements.

Although an example of the semiconductor chip 10 constituting the semiconductor device has been given, the semiconductor device may have another structure different from that shown in FIG. 2A. That is, in addition to the surface electrode such as the source electrode 113 provided in the active region Rb, the semiconductor chip 10 has the pads 12a to 12e arranged in the pad arrangement region Re, and in which the pads 12a to 12e have the double-layer wiring electrode structure whereas the surface electrode has the single-layer wiring electrode structure.

In each of the embodiments described above, the entire pad arrangement region Re overlaps the active region Rb. Alternatively, the pad arrangement region Re may partly overlap the active region Rb.

In each of the embodiments described above, the single-layer wiring electrode structure and the double-layer wiring electrode structure indicate the number of layers of the wiring electrode material such as AlSi. The number of layers of the wiring electrode material referred to here does not include metal layers such as barrier metal layers that are not made of the wiring electrode material.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:

1. A semiconductor device provided by a semiconductor chip, the semiconductor device comprising:
   an active region having a semiconductor element and a surface electrode, the surface electrode:
      composed of a first-layer wiring electrode made of a wiring electrode material,
      connected to the semiconductor element, and
      disposed on a surface of the semiconductor chip, the first-layer wiring electrode being in a first layer on an interlayer insulating film; and
   a pad arrangement region having a pad, the pad composed of a second-layer wiring electrode made of the wiring electrode material, the second-layer wiring electrode being in a second layer above the first layer, wherein
   the pad arrangement region is disposed to overlap the active region in a direction normal to the surface of the semiconductor chip,
   the second-layer wiring electrode forming the pad is disposed above the first-layer wiring electrode forming the surface electrode through an isolation insulating film so that the wiring electrode material is in two layers to provide a double-layer wiring electrode structure and structure,
   the pad is electrically insulated from the surface electrode through the isolation insulating film in the pad arrangement region,
   in a part of the active region without overlapping with the pad arrangement region, the surface electrode has a single-layer wiring electrode structure composed of the first-layer wiring electrode, as a single layer of the wiring electrode material, and has a surface exposed from an opening of a passivation film disposed at the surface of the semiconductor chip,
   in the part of the active region without overlapping with the pad arrangement region, the surface of the surface electrode exposed from the opening of the passivation film defines a top surface of a source electrode, and is at a level lower than a bottom surface of the pad composed of the second-layer wiring electrode,
   the exposed top surface of the surface electrode, as the source electrode, composed of the first-layer wiring electrode, provides an electrode pad surface, in the pad arrangement region, the pad has a single-layer wiring electrode structure composed of the second-layer wiring electrode and has a second surface exposed from a pad opening of the passivation film, and
   the surface electrode extends over an entire bottom side of the pad in the pad arrangement region.

2. The semiconductor device according to claim 1, wherein
   the pad is connected to a wiring layer made of the wiring electrode material and connected to the semiconductor element, and
   the wiring layer has the single-layer wiring electrode structure composed of the single layer of the wiring electrode material.

3. The semiconductor device according to claim 1, wherein
   a total area of one or more regions having the double-layer wiring electrode structure is 30% or less of an area of the active region.

4. The semiconductor device according to claim 1, wherein
   each of the surface electrode and the pad is line symmetrical, as seen from a plan view, with respect to a straight line that is a center line of the semiconductor chip passing through a center of the surface electrode.

5. The semiconductor device according to claim 1, wherein
   the number of pads is five or fewer.

6. The semiconductor device according to claim 1, wherein
   the isolation insulating film is a silicon oxide film.

7. The semiconductor device according to claim 1, wherein
   the isolation insulating film is a silicon nitride film.

8. The semiconductor device according to claim 1, wherein
   the wiring electrode material is made of AlSi.

9. The semiconductor device according to claim 1, wherein
   the semiconductor chip includes a semiconductor substrate made of silicon carbide, and the semiconductor element is provided in the semiconductor substrate.

10. The semiconductor device according to claim 9, wherein
   the semiconductor substrate made of silicon carbide is $n^+$-type.

11. The semiconductor device according to claim 1, wherein
   the semiconductor element is a vertical MOSFET.

12. The semiconductor device according to claim 1, wherein
   the semiconductor element is a vertical IGBT.

13. The semiconductor device according to claim 1, wherein
   from a plan view, the semiconductor chip has a rectangular plate shape.

14. A power module, comprising:
   the semiconductor device according to claim 1;
   a first heat sink;
   a second heat sink; and
   a resin mold, wherein:

the power module functions as a switching element to drive a motor, an upper surface of the semiconductor device is joined, via a joining material, to a lower surface of the first heat sink, a lower surface of the semiconductor device is joined, via the joining material, to an upper surface of the second heat sink, the resin mold encapsulates the semiconductor device, the first heat sink, and the second heat sink.

15. The power module according to claim 14, wherein each of the first heat sink and the second heat sink comprises a top metal layer, an insulating layer, and a bottom metal layer, stacked in that order such that the insulating layer is disposed between the top metal layer and the bottom metal layer.

16. The power module according to claim 15, wherein the bottom metal layer of the first heat sink is divided into a plurality of connecting portions that form the lower surface of the first heat sink.

17. The power module according to claim 16, wherein one of the plurality of connecting portions is connected to the electrode pad surface of the source electrode, and at least another of the plurality of connecting portions is connected to the pad in the pad arrangement region.

* * * * *